United States Patent
Soyama et al.

(10) Patent No.: US 6,629,484 B2
(45) Date of Patent: Oct. 7, 2003

(54) CUTTER WHEEL FOR BRITTLE SHEETS

(75) Inventors: Hiroshi Soyama, Osaka-fu (JP); Kazuya Maekawa, Osaka-fu (JP)

(73) Assignee: Mitsuboshi Diamond Industrial Co., Ltd., Osaka (JP)

( * ) Notice: Subject to any disclaimer, the term of this patent is extended or adjusted under 35 U.S.C. 154(b) by 0 days.

(21) Appl. No.: 09/919,812

(22) Filed: Aug. 2, 2001

(65) Prior Publication Data

US 2002/0033087 A1 Mar. 21, 2002

(30) Foreign Application Priority Data

Aug. 4, 2000 (JP) ........................................ 2000-237241

(51) Int. Cl.⁷ .............................. B26D 3/08; B31B 1/25
(52) U.S. Cl. ...................... 83/886; 30/164.95; 451/541; 125/15
(58) Field of Search .......................... 83/886, 663, 665, 83/698.41, 835; 30/164.95, 347, 307, 319; 125/13.01, 15; 451/449, 540, 541, 548

(56) References Cited

U.S. PATENT DOCUMENTS

| 2,912,021 A | * 11/1959 | Gommel |
| 5,836,229 A | 11/1998 | Wakayama et al. |
| 6,065,215 A | 5/2000 | Arai |

FOREIGN PATENT DOCUMENTS

| JP | 9-267268 | 10/1997 |
| JP | 11-028670 | 2/1999 |

* cited by examiner

Primary Examiner—Derris H. Banks
Assistant Examiner—Ali Abdelwahed
(74) Attorney, Agent, or Firm—Wenderoth, Lind & Ponack, L.L.P.

(57) ABSTRACT

A cutter wheel for forming scribe lines on a brittle plate has a disk with two side planes. The disk has an edge formed at the outer periphery of the disk and a shaft hole formed at the center of the disk for inserting a rotational shaft. Further, at least one groove is formed to extend from a surface of one of the side planes along the shaft hole.

17 Claims, 9 Drawing Sheets

CUTTER WHEEL FOR BRITTLE SHEETS

BACKGROUND OF THE INVENTION

1. Field of the Invention

The present invention relates to a cutter wheel for forming scribe lines to cut a brittle sheet such as a semiconductor wafer, a glass plate or a ceramic plate.

2. Description of Prior Art

A prior art cutter wheel of this type has a disk wheel fabricated by grinding the circumference of a disk-like material made of cemented carbide alloy, sintered diamond or the like so as to form a generally V-shaped edge. The disk wheel is ground further around the center thereof to form a through-hole to which a rotation shaft is fitted. The wheel fabricated as mentioned above is supported in a recess of a chip holder by mounting the rotation shaft in a rotatable manner. The rotation shaft is made of iron, cemented carbide alloy, sintered diamond or the like.

In case that a cutter having a cutter wheel and a rotation shaft made of materials different from each other is used, for example, if the wheel is made of cemented carbide alloy and the shaft is made of iron, then the shaft is abraded remarkably, so that smooth rotation of the cutter wheel will become degraded. Accordingly, the quality of scribe lines becomes worse in a short time. On the other hand, if the wheel is made of cemented carbide alloy and the shaft is made of sintered diamond, the inner diameter of the through-hole for fitting the shaft becomes larger due to abrasion between the wheel and the shaft. Accordingly, smooth rotation of the cutter wheel becomes degraded though it takes a longer time than the previous example. Further such a combination of different materials makes a product expensive.

Therefore, it is conventional to make the cutter wheel and the rotation shaft by making use of the same material. However, if the same material is used, heat is generated due to abrasion between them, and seizure between them occurs. Resultantly, smooth rotation of the cutter wheel becomes degraded. If an object to be cut is a glass sheet, glass fibers are generated, thereby resulting in problems of scribe quality in a short time while scribing is performed.

SUMMARY OF THE INVENTION

An object of the present invention is to provide a cutter wheel for brittle sheets which forms scribe lines of high quality at a higher scribing speed in a longer line length to be scribed than a prior art one.

A cutter wheel according to the invention for forming scribe lines on a brittle sheet, comprises a disk with two side planes. The disk has a generally V-shaped edge formed at an outer periphery thereof and a shaft hole formed at the center thereof for inserting a rotational shaft. The cutter wheel comprises at least one groove extending from a surface of one of the side planes along the shaft hole. The groove may be provided in various ways. For example, the groove may extend in the axial direction. The groove may have a length in the axial direction of one to three quarters of the thickness of the cutter wheel. The groove may extend obliquely or spirally to the axial direction. The depth of the recesses may be set to about one to three fourths of the thickness of the cutter wheel. It is effective that the rotation shaft is made of the same material as the cutter wheel.

An advantage of the present invention is that the cutter wheel is rotated smoothly so that the scribing is performed smoothly.

BRIEF DESCRIPTION OF THE DRAWINGS

These and other objects and features of the present invention will become clear from the following description taken in conjunction with the preferred embodiments thereof with reference to the accompanying drawings, and in which.

DETAILED DESCRIPTION OF THE PREFERRED EMBODIMENTS

Figure 1A:
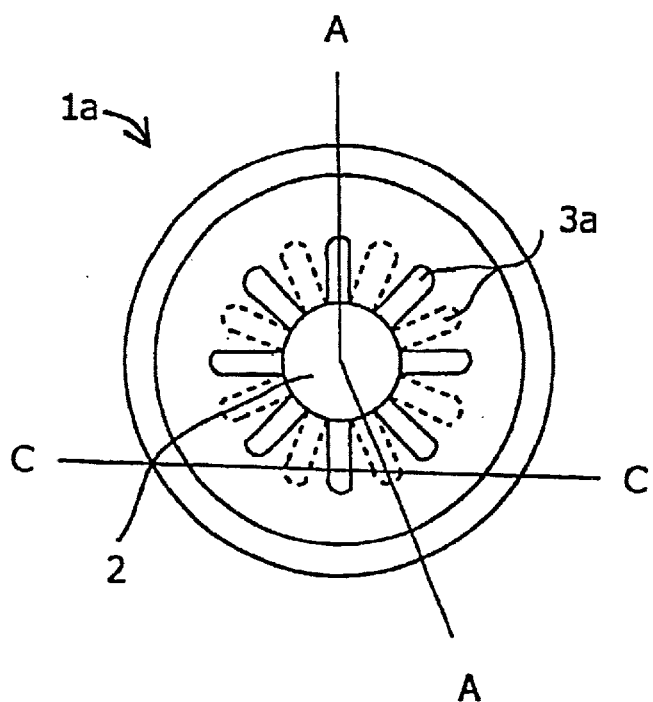
FIGS. 1A and 1B are a side view and a sectional view of a cutter wheel of an embodiment.
Figure 1B:
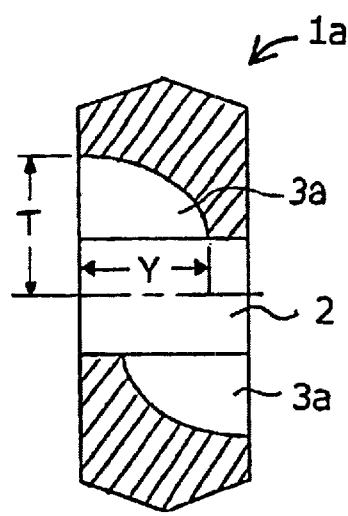

Referring now to the drawings, wherein like reference characters designate like or corresponding parts throughout the several views, FIG. 1A is a side view of a cutter wheel 1a according to an embodiment of the invention, and FIG. 1B is a sectional view along line A—A in FIG. 1A. The cutter wheel 1a has a disk with two side planes, and it has a circumference with a generally V-shaped edge and a shaft hole 2 at the center thereof into which a rotation shaft for the cutter wheel 1a is inserted. Thus, the wheel 1a has an outer diameter and an inner diameter. Further, at the inner peripheral plane of the shaft hole 2, eight grooves 3a (represented by solid lines) of a predetermined length are formed with an equal circumferential distance between them and along the axial direction (or a direction of the thickness of the wheel) extending from a first side plane to a second one. On the other hand, eight additional grooves 3a (represented as dashed lines) of the predetermined length are similarly formed at an equal circumferential distance between them and extending in the opposite axial direction from the second side plane to the first one. In FIG. 1A, the first grooves 3a represented as solid lines and the second grooves 3a represented as dashed lines observed from the first side plane of the wheel are located in a state having inverted phases between them. That is, a first groove 3a is located at the center between two second grooves, or vise versa, when observed from a side plane of the wheel. The depth of the grooves 3a in the radial direction decreases from the surface of the side plane to the inside thereof.

Figure 2A:
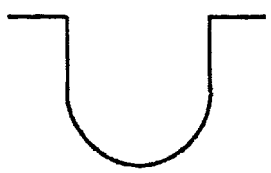
FIGS. 2A, 2B and 2C are sectional views of grooves of cutter wheels.
Figure 2B:
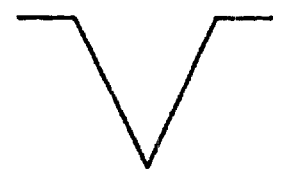
Figure 2C:
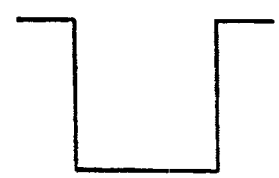

The grooves 3a, as observed along section C—C of FIG. 1A, have a U-character shape as shown in FIG. 2A. However, they may have a V-character-like shape as shown in FIG. 2B or a rectangular shape as shown in FIG. 2C. The grooves of different shapes may have similar functions and advantages.

The width of the groove 3a is, for example, $1/48$ to $1/2$ of the circumference of the shaft hole 2, depending on the outer diameter of the cutter wheel 1a. The depth (T) of the groove 3a in the radial direction from the axial center of the cutter wheel is selected so that $1/20 < T/S < 1$ wherein S denotes a difference between the outer radius and the inner radius of the cutter wheel.

In an example of this embodiment, the inner diameter of the cutter wheel 1a is 0.8 mm, the width of the groove 3a is about 0.15 mm, and the depth thereof is about 0.4 mm.

Figure 3A:
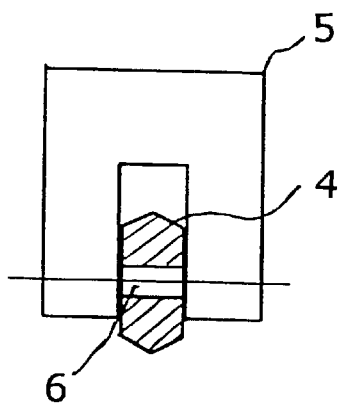
FIGS. 3A and 3B are diagrams for illustrating a prior art cutting wheel and a cutter wheel of the present invention fitted to a holder.
Figure 3B:
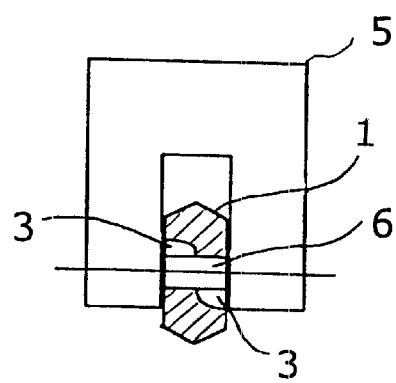

FIGS. 3A and 3B illustrate a prior art cutter wheel 4 and a cutter wheel 1 of the invention fitted to a shaft 6, respectively. The shaft is further mounted to a chip holder 5 in a rotatable manner. As will be understood by comparing FIGS. 3A and 3B, in the case of the cutter wheel 1 of this embodiment shown in FIG. 3B (and of the other embodiments to be explained later), the contact area of the inner peripheral plane of the wheel 1 with the shaft 6 is decreased largely relative to that of a combination of the prior art cutter wheel 4 with the shaft 6 shown in FIG. 3A. The contact area of the two side planes of the wheel 1 with an inner wall of the chip holder 5 is also decreased. Then, the abrasion resistance can be decreased while the cutter wheel is rotated.

Further, there is a clearance between the inner wall of the chip holder 5 and the side planes of the cutter wheel 1, though the clearance is very small. The grooves 3 take ambient air at the two side planes of the wheel 1 and remove dust generated due to the abrasion between the inner peripheral plane of the shaft hole 2 and the shaft 6 and between the inner wall of the chip holder 5 and the side planes of the wheel 1, while suppressing the heat generated by the abrasion.

The length Y in the axial direction of the groove 3a, shown in FIG. 1B, is the most advantageous for the decrease in abrasion when it is about 3/4 of the thickness of the cutter wheel 1a.

When a shaft 6 made of cemented carbide alloy is combined with a cutter wheel 1 made of the same material, a test is performed on the cutter wheel of the invention and on the prior art cutter wheel to determine how long scribing is possible until a defect is produced. Table 1 shows the result of the measured distance.

TABLE 1

| Test result | |
|---|---|
| cutter wheel (invention) | cutter wheel (prior art) |
| 1,000–2,000 m | 10–20 m |

The scribing conditions for the test are as follows. The object subjected to scribing is a soda glass plate. The scribing speed is 300 mm/s. The load weight at the edge of the cutter wheel is 1.1 kg. The outer diameter of the cutter wheel is 2.5 mm, the thickness thereof is 0.65 mm, the inner diameter thereof is 0.8 mm, the edge angle at the edge is 120°, and the outer diameter of the shaft 6 is 0.8 mm. The shaft 6 is fixed completely, or only the cutter wheel 1 is rotated while scribing. Further, scribe lines are formed on the glass plate in parallel with a distance of 0.5 mm between them.

As will be understood from the result shown in Table 1, the scribing performance of the cutter wheel 1a of the invention is improved by 100 to 200 times if compared with the prior art cutter wheel 4.

Various types of cutter wheels are possible, and some of them are further explained below.

Figure 5A:
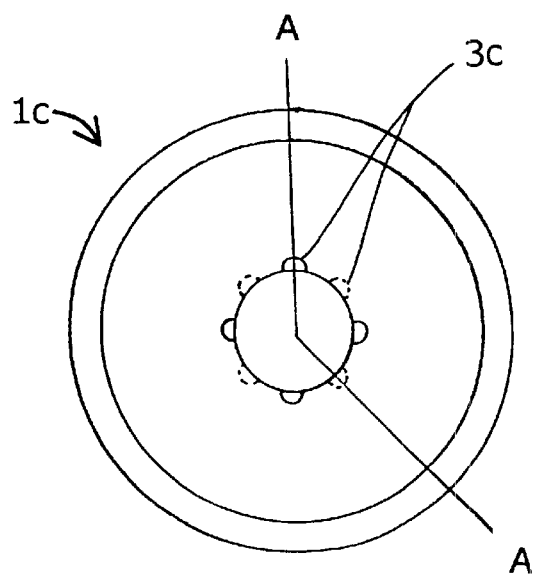
FIGS. 5A and 5B are a side view and a sectional view of a cutter wheel of a third embodiment.
Figure 5B:
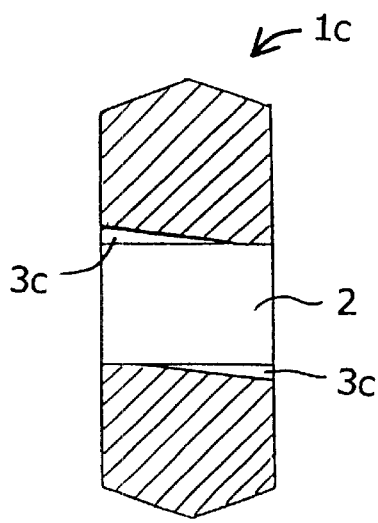
Figure 6A:
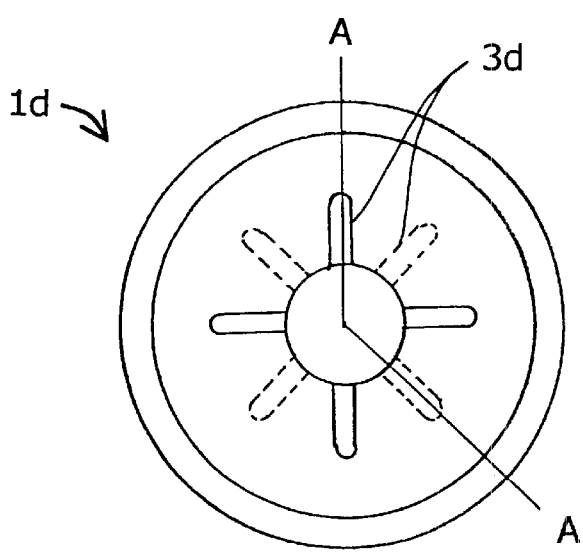
FIGS. 6A and 6B are a side view and a sectional view of a cutter wheel of a fourth embodiment.
Figure 6B:
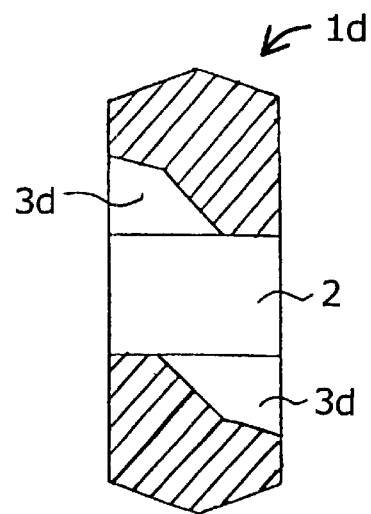
Figure 7A:
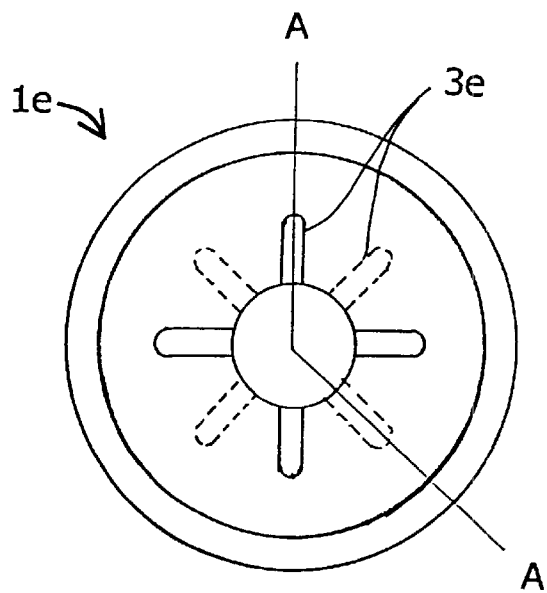
FIGS. 7A and 7B are a side view and a sectional view of a cutter wheel of a fifth embodiment.
Figure 7B:
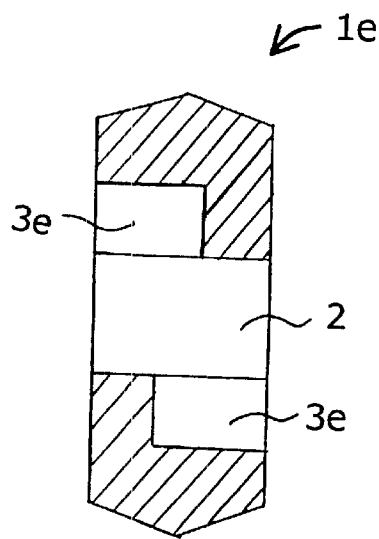

FIGS. 4A and 4B to 15A and 15B show different examples of the groove. In cutter wheels 1b and 1c shown in FIGS. 4A and 4B, and 5A and 5B, the depth of the groove 3b, 3c is changed linearly along the axial direction (the or thickness direction of the cutter wheel). The grooves 3c shown in FIGS. 5A and 5B have a gentler slope than the grooves 3b shown in FIGS. 4A and 4B. In a cutter wheel 1d shown in FIGS. 6A and 6B, the depth of grooves 3d is changed at two stages in the axial direction. In a cutter wheel 1e shown in FIGS. 7A and 7B, the depth of grooves 3e is constant in the axial direction.

Figure 4A:
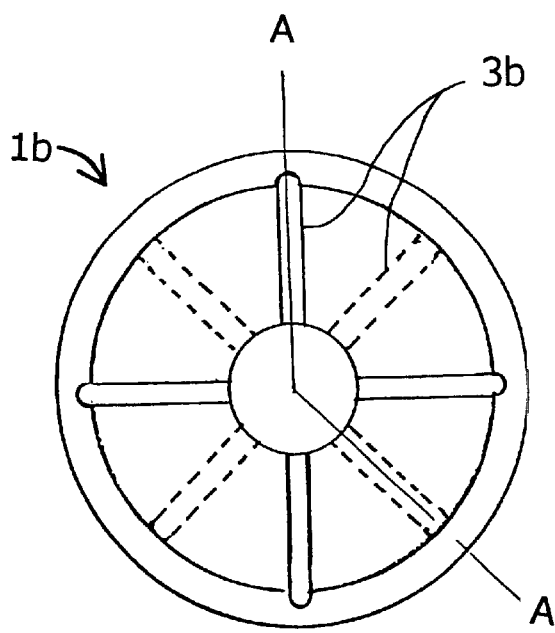
FIGS. 4A and 4B are a side view and a sectional view of a cutter wheel of a second embodiment.
Figure 4B:
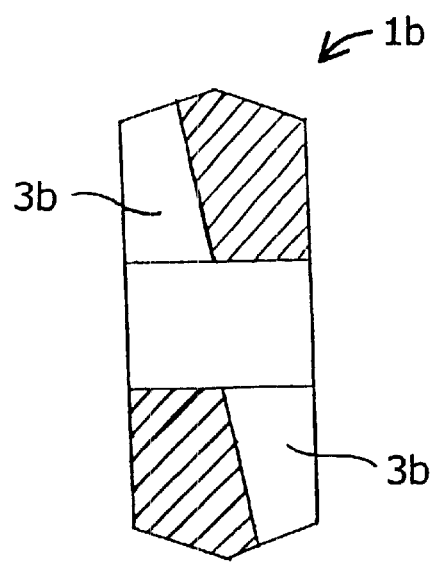
Figure 8A:
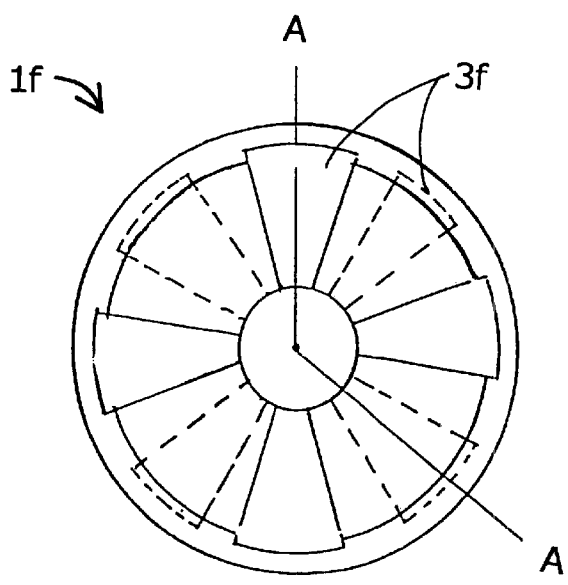
FIGS. 8A and 8B are a side view and a sectional view of a cutter wheel of a sixth embodiment.
Figure 8B:
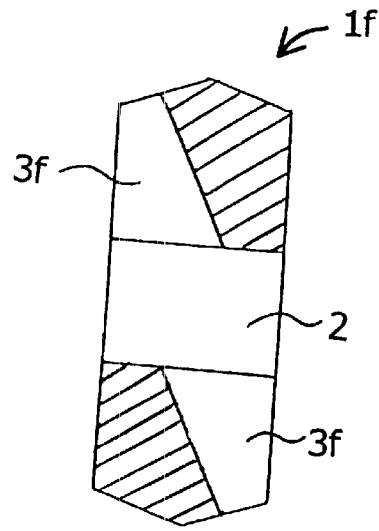

A cutter wheel 1f shown in FIGS. 8A and 8B has eight grooves 3f having sections similar to the grooves 3b shown in FIGS. 4A and 4B. However, the groove 3f has a width increasing with increasing distance from the inner peripheral plane of the hole 2.

Figure 9A:
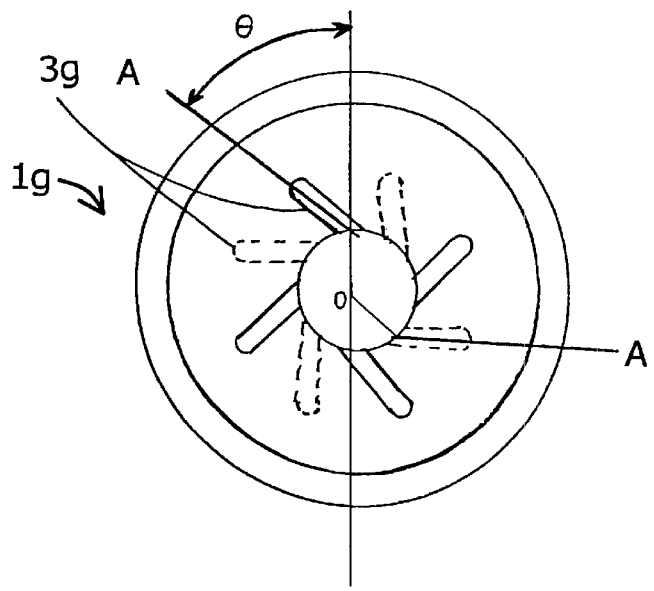
FIGS. 9A and 9B are a side view and a sectional view of a cutter wheel of a seventh embodiment.
Figure 9B:
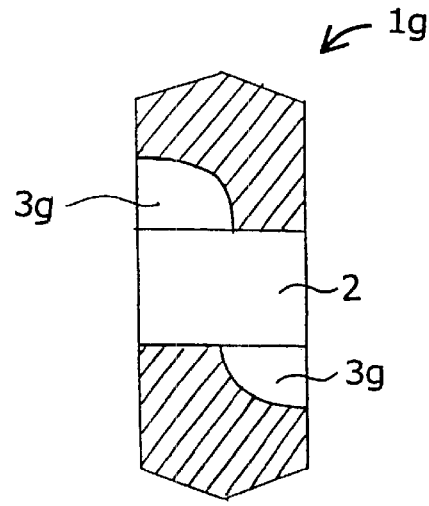

A cutter wheel 1g shown in FIGS. 9A and 9B has eight grooves 3g having sections similar to the grooves 3a shown in FIGS. 1A and 1B. The grooves 3g extend in the thickness direction, as in the previous embodiments. However, the grooves 3g are inclined by an angle θ relative to the radial direction whereas the grooves 3a shown in FIGS. 1A and 1B extend in the radial direction. By forming grooves 3g extending obliquely by a predetermined angle from the radial direction, as explained above, it becomes easier to take ambient air around the side planes of the cutter wheel 1g. This suppresses effectively the generation of heat due to the abrasion between the inner peripheral wall of the cutter wheel 1g and the shaft.

Figure 10A:
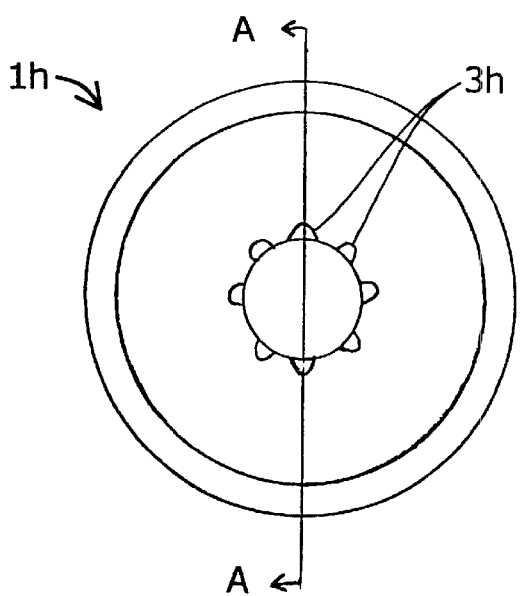
FIGS. 10A and 10B are a side view and a sectional view of a cutter wheel of an eighth embodiment.
Figure 10B:
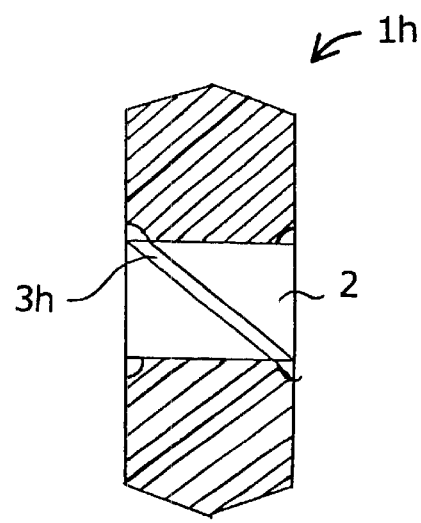

A cutter wheel 1h shown in FIGS. 10A and 10B has four grooves 3h which extend along the inner peripheral wall of the hole 2 obliquely relative to the axial direction, to the other side plane to a point symmetrical to the center of the cutter wheel 1h. The sectional shape of the groove 3h may be V-character-like, trapezoidal, U-character-like or the like.

Figure 11A:
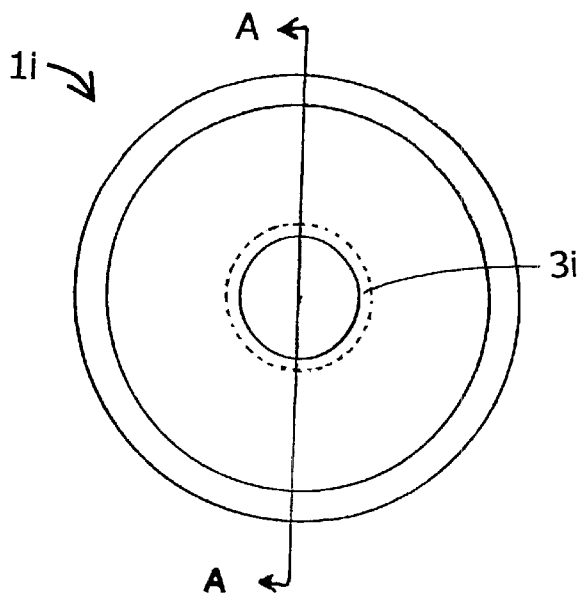
FIGS. 11A and 11B are a side view and a sectional view of a cutter wheel of a ninth embodiment.
Figure 11B:
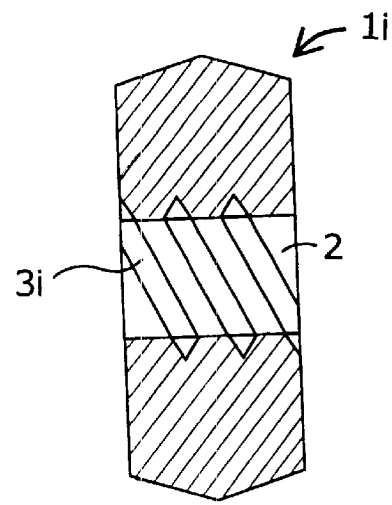

A cutter wheel 1i shown in FIGS. 11A and 11B has a spiral groove 3i extending along the inner peripheral wall of the hole 2. The spiral pitch is set to 0.1 to 1.5 mm. The sectional shape of the groove 3i may be V-character-like, trapezoidal, U-character-like or the like. Though FIGS. 11A and 11B show an example of the cutter wheel 1*i* having one spiral groove 3*i*, it is more preferable that it has a plurality of grooves 3*i*.

Figure 12A:
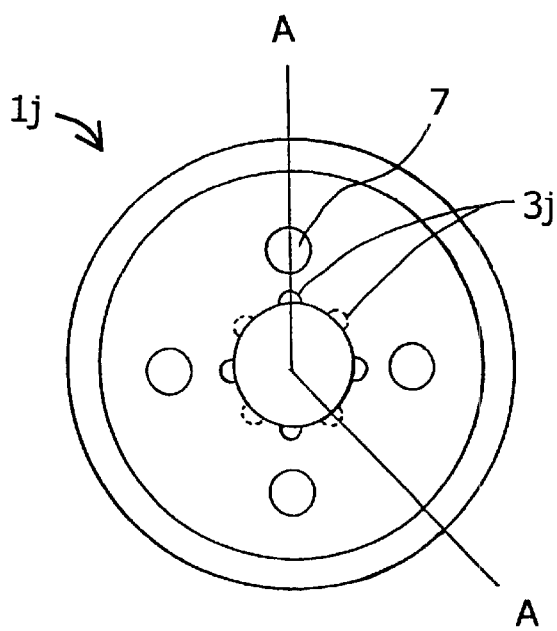
FIGS. 12A and 12B are a side view and a sectional view of a cutter wheel of a tenth embodiment.
Figure 12B:
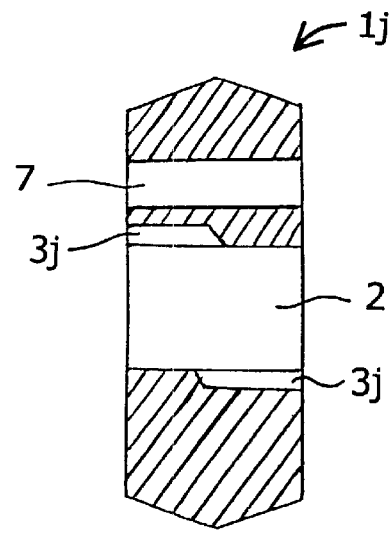

A cutter wheel 1*j* shown in FIGS. 12A and 12B has eight grooves 3*j* formed along the shaft hole 2. Further, it has four through-holes 7 extending in the thickness direction of the wheel 1*j*. The four holes 7 are arranged between the outer periphery and the shaft hole 2 at an equal distance between them, symmetrically relative to the center of the hole 2.

Figure 13A:
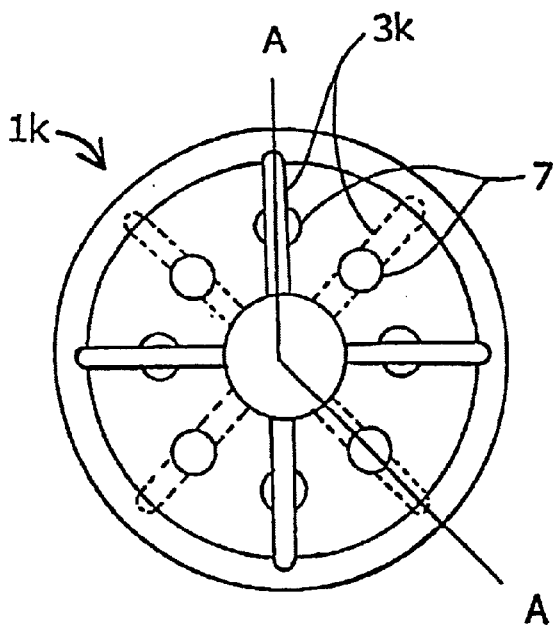
FIGS. 13A and 13B are a side view and a sectional view of a cutter wheel of an eleventh embodiment.
Figure 13B:
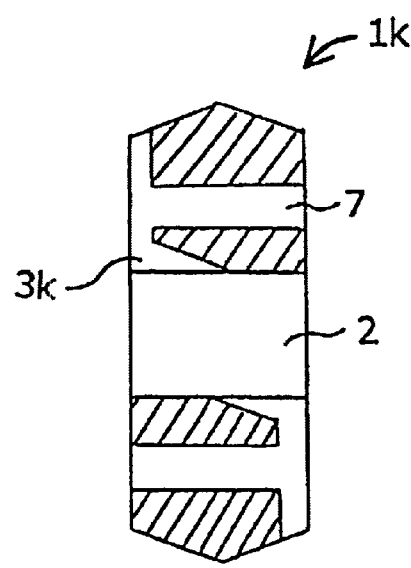

A cutter wheel 1*k* shown in FIGS. 13A and 13B has eight through-holes 7 extending in the thickness direction thereof as well as eight grooves 3*k* formed along the shaft hole 2. Further, the grooves 3*k* extend towards the outer periphery near the side plane, and they are respectively connected to the holes 7.

Figure 14A:
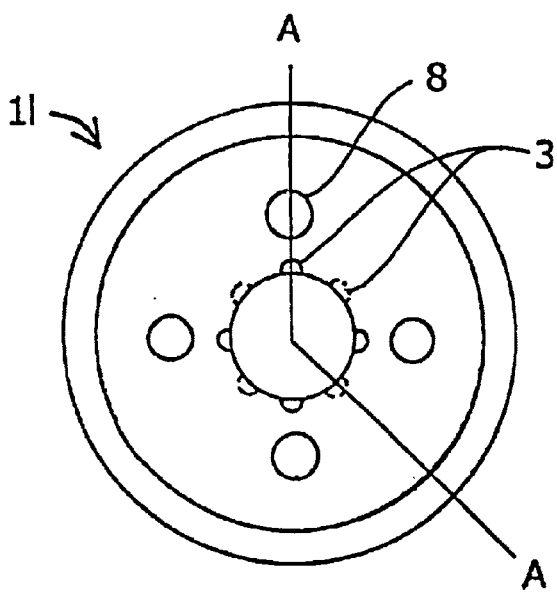
FIGS. 14A and 14B are a side view and a sectional view of a cutter wheel of a twelfth embodiment.
Figure 14B:
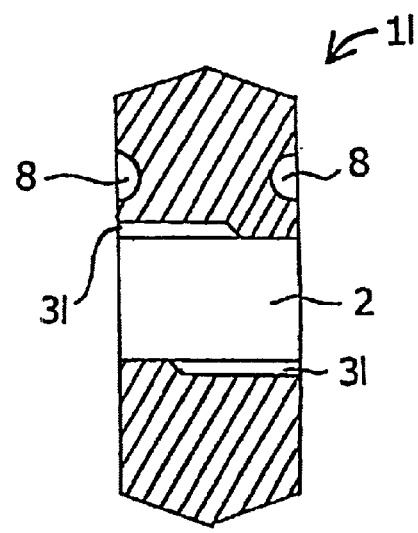

A cutter wheel 1*l* shown in FIGS. 14A and 14B has four recesses 8 of a predetermined depth in each side plane of the cutter wheel 1*l*, besides eight grooves 3*l* formed around the inner peripheral plane at the shaft hole 2. The recesses 8 have a semi-spherical shape.

Figure 15A:
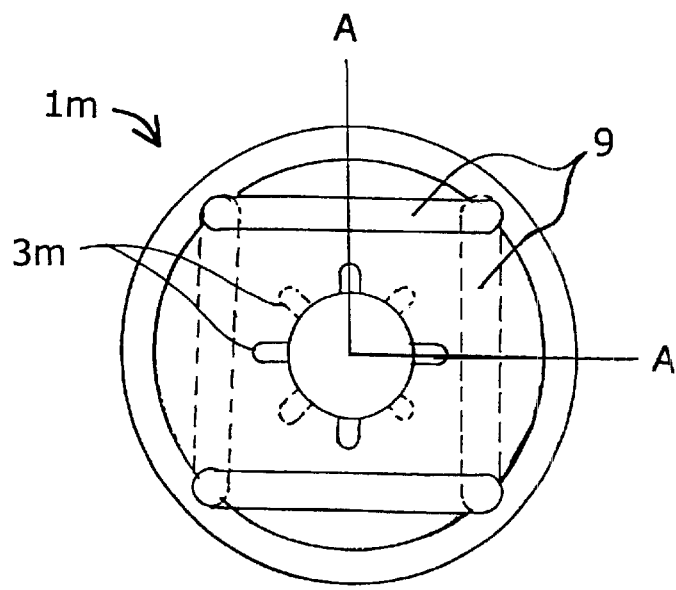
FIGS. 15A and 15B are a side view and a sectional view of a cutter wheel of a thirteenth embodiment.
Figure 15B:
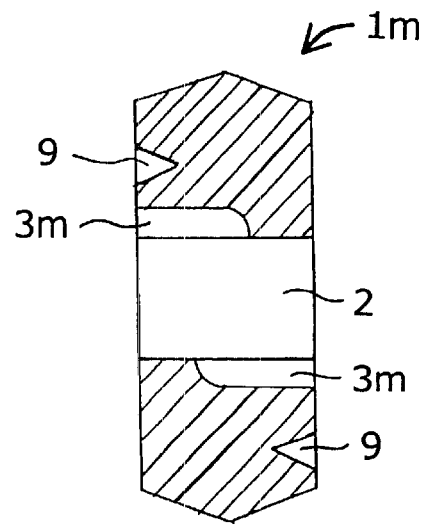

A cutter wheel 1*m* shown in FIGS. 15A and 15B has two recesses 9 of a predetermined depth in each side plane of the cutter wheel 1*m*, besides eight grooves 3*m* formed along the shaft hole 2. The recess 9 extends linearly and perpendicularly to the radial directions A, respectively.

A cutter wheel 1 can also be fabricated by combining a bushing with a cutter wheel material, as explained below. By using such a cutter wheel 1 fabricated by fitting or inserting the bushing to the cutter wheel material, a similar advantage can be realized as the above-mentioned cutter wheels.

Figure 16:
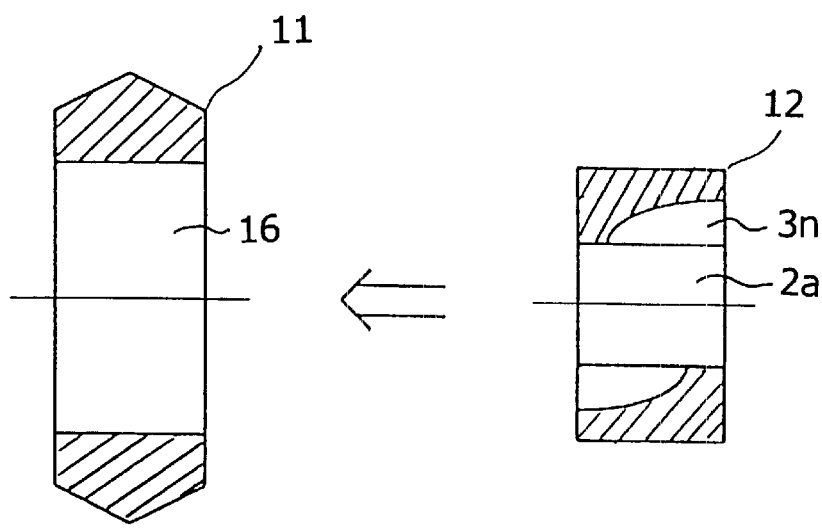
FIG. 16 is a diagram for illustrating a situation for fitting a bush to a cutter wheel material.
Figure 17:
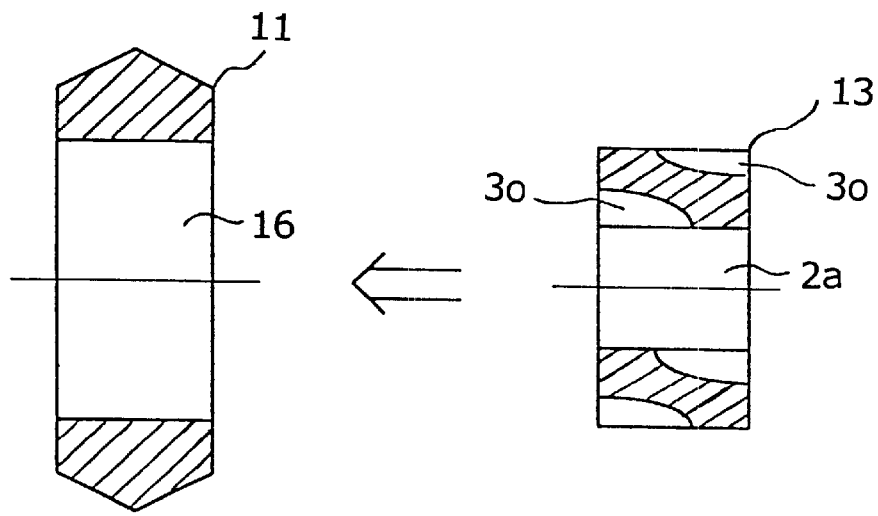
FIG. 17 is another diagram for illustrating a situation for fitting a bush to a cutter wheel material.

FIG. 16 illustrates a situation for fitting or inserting a disk-like bushing 12 to a cutter wheel material 11 having a circular inner hole 16 for fabricating a cutter wheel. The bushing 12 has a through-hole 2*a* and a plurality of grooves 3*n*, similarly to the various cutter wheels explained above, extending from a surface of a side plane along the inner peripheral plane of the hole 2*a* and in the radial direction. FIG. 17 illustrates another situation for fitting a bushing 13 to a cutter wheel material 11. The bushing 13 has grooves 3*o* along the inner peripheral plane of the hole 2*a* and along an outer peripheral plane of the bushing 13. The grooves 3*o* extend from a surface of one of the side planes along the inner and outer peripheral planes, respectively in the radial direction. The outer peripheral plane of the bushings 12, 13 is fitted or inserted to a circular hole 16 of the cutter wheel material 11 to fabricate a cutter wheel.

The grooves 3*n*, 3*o* in the bushing 12, 13 may have various forms as adopted in the above-mentioned cutter wheels. For example, the grooves 3*n*, 3*o* may be formed alternately at the two side planes of the bushings 12, 13 as shown in FIG. 1. Further, the grooves 3*n*, 3*o* in the bushings 12, 13 may be formed with an equal interval between them. Still further, the grooves 3*n*, 3*o* in the bushings 12, 13 may be formed to have a predetermined angle relative to the radial direction at the two side planes of the bushings 12, 13, as shown in FIG. 9A. In another way, the bushings 12, 13 may be formed to have recesses or through-holes, as shown in FIGS. 12A to 15B. Further, various features of the grooves, recesses and through-holes may also be combined.

Figure 18:
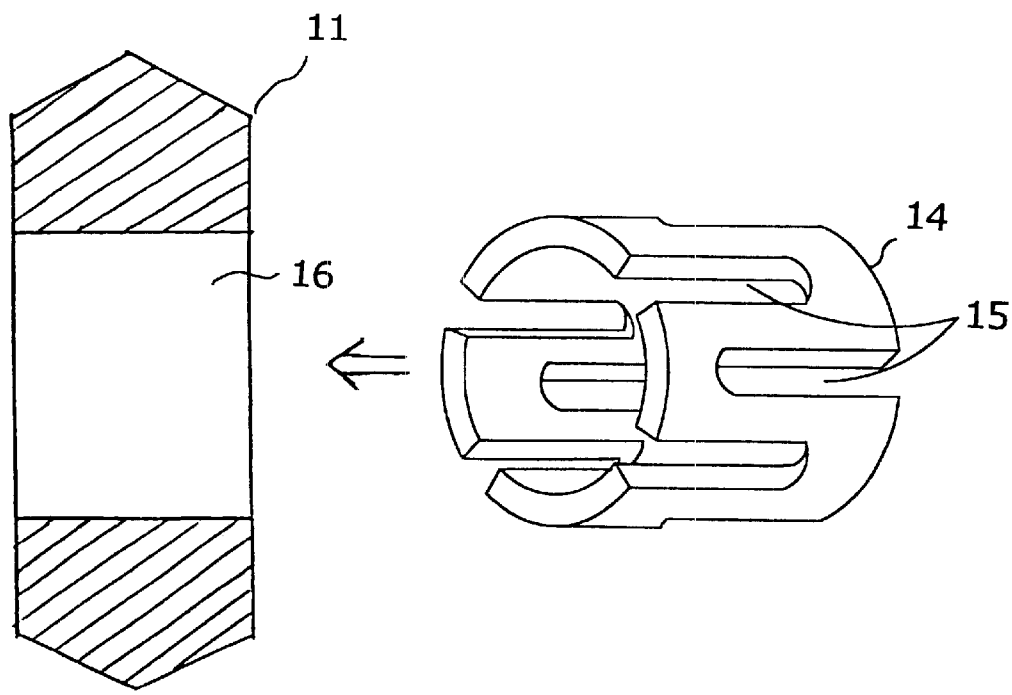
FIG. 18 is a further diagram for illustrating a situation for fitting a bush to a cutter wheel material.

FIG. 18 illustrates a further situation for fitting a bushing 14 to a cutter wheel material 11. The bushing 14 has a cylindrical shape, and it has cut-away portions 15 extending from one of the ends thereof in the axial direction. The outer peripheral plane of the bush 14 is fitted or inserted into an inner circular hole 16 of the cutter wheel material 11 to fabricate a cutter wheel.

The cut-away portions 15 in the bushing 14 may also have various forms. The cut-away portions 15 in the bushing 14 may be formed alternately as shown in FIG. 9B at the two side planes of the bushing 14. Further, the cut-away portions 15 in the bushing 14 may be formed with an equal interval between them. Still further, the cut-away portions 15 may be formed to have a predetermined angle relative to the radial direction at the two side planes of the bushing 14. The cut-away portions 15 may have a length of one to three quarters of the length of the bushing 14 in the axial direction.

The grooves as explained above may also be formed at the shaft hole of a different type of cutter wheel. That is, the grooves may be formed for a cutter wheel having an edge at the outer periphery with a microscopic structure as described in U.S. Pat. No. 5,836,229 to Wakayama et al.

In the above-mentioned cutter wheels, grooves are provided along the axial direction, obliquely to the axial direction or spirally at the inner peripheral plane for inserting the rotation shaft. Therefore, abrasion resistance is decreased between the inner peripheral plane thereof and the rotation shaft, and between the cutter wheel and the inner wall of the chip holder. Thus, the cutter wheel can be rotated smoothly, and defective scribing does not occur as readily.

Further, by providing recesses or through-holes in a cutter wheel, dust due to abrasion can be removed. Therefore, the performance of the cutter wheel is increased 100 to 200 times if it is evaluated on scribing length.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A cutter wheel for forming scribe lines on a brittle sheet, comprising a disk with two side planes, with a V-shaped edge formed at an outer periphery thereof, and with a cylindrical shaft hole formed at a center thereof for inserting a rotational shaft, wherein at least one groove extends from a surface of one of said two side planes along said shaft hole without reaching a surface of the other of said two side planes.

2. A cutter wheel according to claim 1, wherein said at least one groove extends in an axial direction of said disk.

3. A cutter wheel according to claim 2, wherein said at least one groove has a length in the axial direction of one to three quarters of a thickness of said disk.

4. A cutter wheel according to claim 1, wherein said at least one groove extends obliquely to an axial direction of said disk.

5. A cutter wheel according to claim 4, wherein said at least one groove extends spirally along said shaft hole.

6. A cutter wheel according to claim 1, wherein said at least one groove has a rectangular shape with a cross section of a shape selected from U-shape and V-shape forms.

7. A cutter wheel according to claim 1, wherein a depth of said at least one groove is constant along an axial direction of said disk.

8. A cutter wheel according to claim 1, wherein said at least one groove comprises plural grooves, said grooves are formed at equal intervals in a circumferential direction, and said grooves extend alternately from the surface of said one of said two side planes and from the surface of said other of said two side planes.

9. A cutter wheel according to claim 1, further comprising at least one through-hole extending in a thickness direction of said disk.

10. A cutter wheel according to claim 9, wherein one of said at least one through-hole is connected to one of said at least one groove.

11. A cutter wheel according to claim 1, at least one of said two side planes is formed with at least one recess.

12. A cutter wheel according to claim 11, wherein said at least one recess has a semi-spherical shape.

13. A cutter wheel according to claim 11, wherein said at least one recess extends perpendicularly to at least one radial direction, respectively, of said disk.

14. A cutter wheel for forming scribe lines on a brittle sheet, comprising a disk with two side planes, with a V-shaped edge formed at an outer periphery thereof, and with a shaft hole formed at a center thereof for inserting a rotational shaft, wherein at least one groove extends from a surface of said two side planes along said shaft hole, and wherein a depth of said at least one groove decreases from a surface of one of said two side planes towards an inside thereof.

15. A cutter wheel for forming scribe lines on a brittle sheet, comprising a disk with two side planes, with a V-shaped edge formed at an outer periphery thereof, and with a shaft hole formed at a center thereof for inserting a rotational shaft, wherein at least one groove extends from a surface of said two side planes along said shaft hole, wherein said at least one groove comprises first grooves extending from a first one of said two side planes, wherein second grooves extend from a second one of said two side planes, and wherein said first and second grooves are located alternately in a circumferential direction of said shaft hole.

16. A cutter wheel for forming scribe lines on a brittle sheet, comprising a disk with two side planes, with a V-shaped edge formed at an outer periphery thereof, and with a shaft hole formed at a center thereof for inserting a rotational shaft, wherein at least one groove extends from a surface of said two side planes along said shaft hole, and wherein said at least one groove has a width increasing with increasing distance from said shaft hole.

17. A cutter comprising:

a cutter wheel comprising a disk with two side planes, with a V-shaped edge formed at an outer periphery thereof and with a cylindrical shaft hole formed at a center thereof for inserting a rotational shaft, wherein at least one groove extends from a surface of one of said two side planes along said shaft hole without reaching a surface of the other of said two side planes;

a rotation shaft arranged to be fitted to said shaft hole of said cutter wheel; and a holder for supporting said rotation shaft.

* * * * *